(12) United States Patent
Suzuki et al.

(10) Patent No.: US 11,443,788 B1
(45) Date of Patent: Sep. 13, 2022

(54) REFERENCE-VOLTAGE-GENERATORS WITHIN INTEGRATED ASSEMBLIES

(71) Applicant: Micron Technology, Inc., Boise, ID (US)

(72) Inventors: Takamasa Suzuki, Tokyo (JP); Yasuo Satoh, Tokyo (JP); Yuan He, Boise, ID (US); Hyunui Lee, Gyeonggi-do (KR)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/204,063

(22) Filed: Mar. 17, 2021

(51) Int. Cl.
  *G11C 5/14* (2006.01)
  *G11C 8/08* (2006.01)
  *G11C 7/06* (2006.01)

(52) U.S. Cl.
  CPC .......... *G11C 8/08* (2013.01); *G11C 5/147* (2013.01); *G11C 7/06* (2013.01)

(58) Field of Classification Search
  CPC ............ G11C 8/08; G11C 5/147; G11C 7/06
  USPC .................................................. 365/189.09
  See application file for complete search history.

(56) References Cited

U.S. PATENT DOCUMENTS

| 5,459,684 | A | 10/1995 | Nakamura et al. |
| 6,687,150 | B1 | 2/2004 | Joachim et al. |
| 9,595,323 | B1 * | 3/2017 | Chen ............... G11C 11/16 |
| 10,607,988 | B2 | 3/2020 | Karda et al. |
| 10,867,671 | B1 * | 12/2020 | Hamada ............ G11C 13/003 |
| 2006/0077740 | A1 * | 4/2006 | Lee ..................... G11C 7/14 365/189.08 |
| 2009/0016100 | A1 * | 1/2009 | Jeong ............... G11C 13/0004 365/210.1 |
| 2014/0192588 | A1 | 7/2014 | Lee et al. |
| 2015/0085561 | A1 | 3/2015 | Maeda et al. |
| 2019/0088322 | A1 | 3/2019 | Pyo et al. |
| 2019/0164985 | A1 * | 5/2019 | Lee ................... H01L 27/10873 |
| 2020/0051659 | A1 | 2/2020 | Matsubara |
| 2021/0249416 | A1 | 8/2021 | Li et al. |

OTHER PUBLICATIONS

Lee et al., U.S. Appl. No. 17/144,461, titled "Reference-Voltage-Generators Within Integrated Assemblies", filed Jan. 6, 2021, 40 pages.

\* cited by examiner

*Primary Examiner* — Huan Hoang
(74) *Attorney, Agent, or Firm* — Wells St. John P.S.

(57) ABSTRACT

Some embodiments include an integrated assembly having a memory region with memory cells and sense/access lines configured for addressing the memory cells, and having a reference-voltage-generator proximate to the memory region. The reference-voltage-generator includes resistive units configured substantially identically to the sense/access lines. Some embodiments include an integrated assembly having a memory region with memory cells, digit lines and wordlines. Each of the memory cells is uniquely addressed with one of the wordlines in combination with one of the digit lines. The wordlines are coupled with driver circuitry and the digit lines are coupled with sensing circuitry. A reference-voltage-generator is proximate to the memory region. The reference-voltage-generator includes resistive units configured substantially identically to the wordlines and/or includes resistive units configured substantially identically to the digit lines.

30 Claims, 16 Drawing Sheets

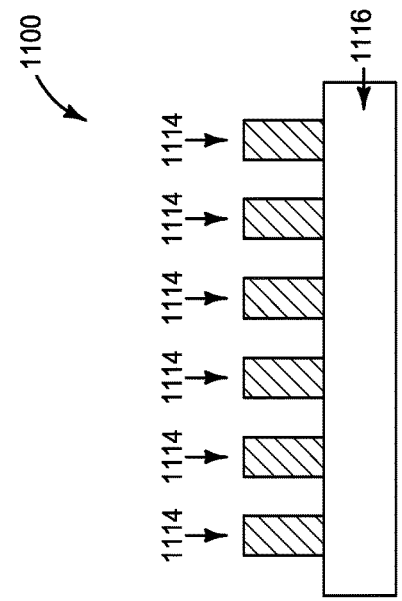
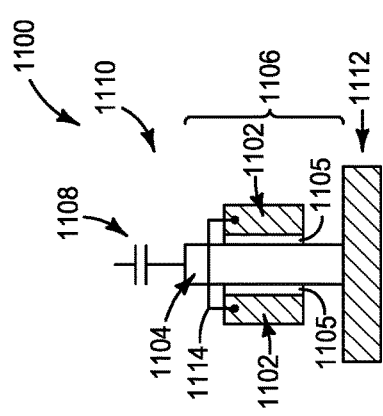
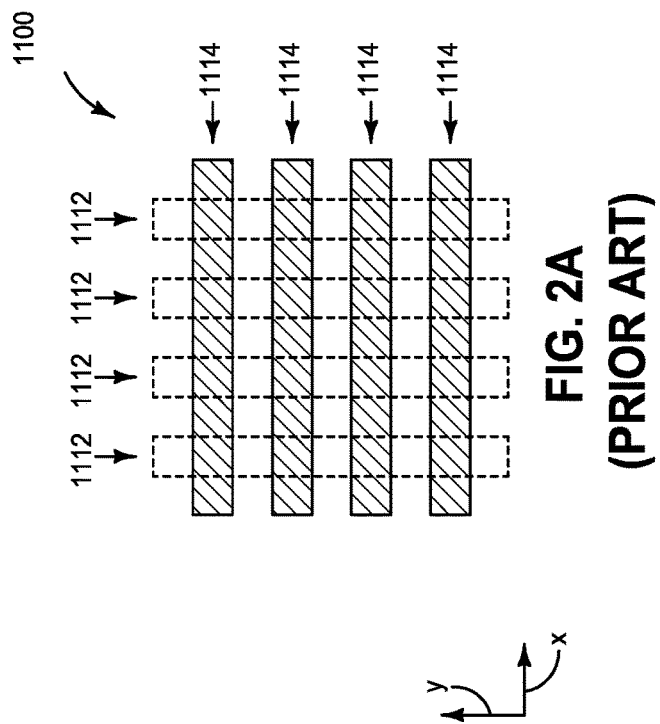

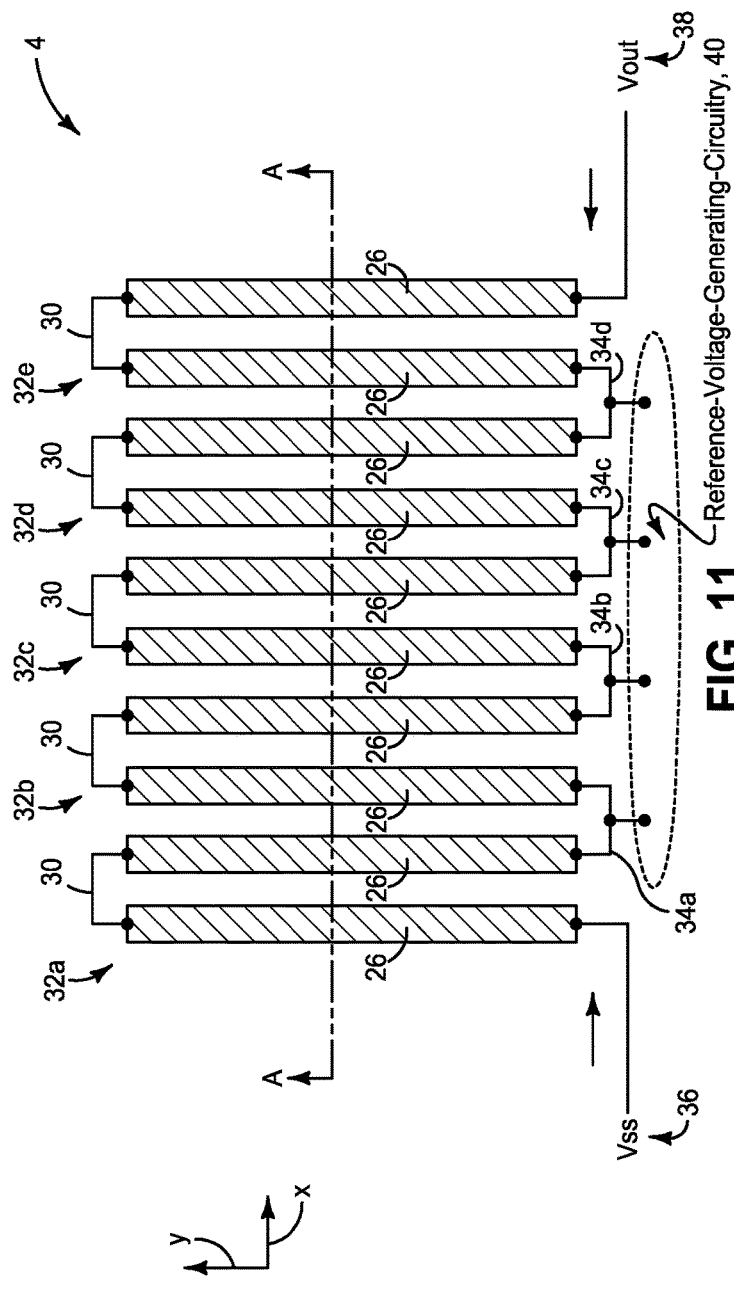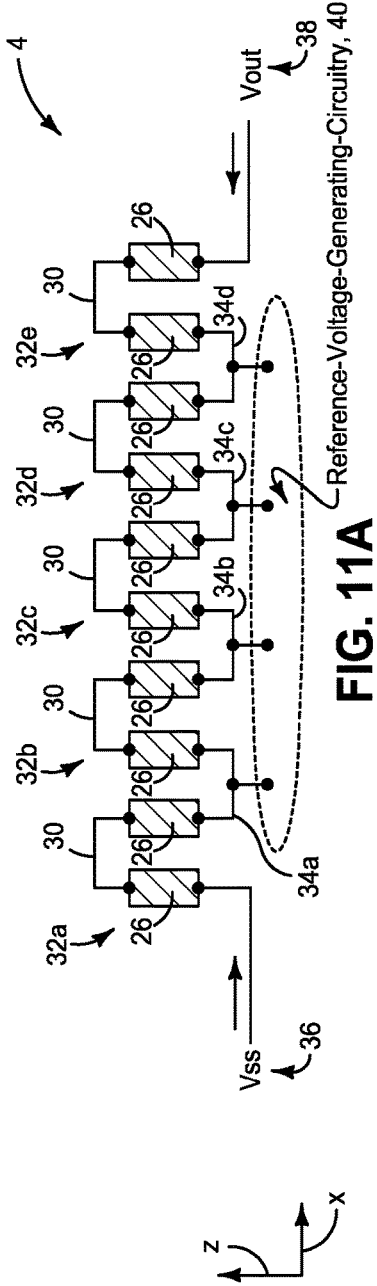
FIG. 11
FIG. 11A

REFERENCE-VOLTAGE-GENERATORS WITHIN INTEGRATED ASSEMBLIES

TECHNICAL FIELD

Integrated assemblies. Reference-voltage-generators.

BACKGROUND

Integrated circuits may utilize reference voltages for numerous applications. For example, reference voltages may be coupled with capacitor plates, shield lines, data sense amplifiers, etc.

It may be desired to generate a reference voltage (VREF) in a suitable manner so that the reference voltage is accurate and controllable. An example reference-voltage-generator 1000 is described with reference to FIG. 1.

The reference-voltage-generator 1000 includes a number of resistive components 1002 arranged in series between a VDD supply terminal 1004 and a VSS supply terminal 1006. The resistive components are coupled through switches 1008 to a feed line 1010 associated with a gain buffer 1012. The VREF is output from the gain buffer.

The switches 1008 may be utilized to control how many of the resistive components 1002 are electrically coupled to the feed line 1010, and thus to control the VREF output from the gain buffer 1012. The switches 1008, feed line 1010 and gain buffer 1012 may be considered to be examples of reference-voltage-generating-circuitry; or, in other words, examples of circuitry coupled to the resistive components 1002 within the reference-voltage-generator 1000.

In some applications, integrated circuitry may comprise memory. Example prior art memory configurations are described with reference to FIGS. 2-6.

FIG. 2 shows a region of a memory configuration 1100. The example region includes a memory cell 1110 over a digit line 1112.

The memory cell includes a capacitor 1108 coupled with a transistor (access device) 1106.

The transistor 1106 includes a semiconductor pillar 1104, and includes gating structures 1102 proximate to the pillar 1104. The structures 1102 are spaced from the pillar 1104 by gate dielectric material 1105.

The pillar 1104 comprises semiconductor material, such as, for example, silicon. The gating structures 1102 selectively control electrical flow through the pillar 1104, and thus control electrical coupling between the capacitor 1108 and the digit line 1112.

The gating structures 1102 are along a wordline 1114 that extends in and out of the page relative to the cross-section of FIG. 2. FIG. 2A shows a top-down view of the memory configuration 1100, and illustrates a relationship of the wordlines 1114 and digit lines 1112; and specifically shows that the wordlines 1114 may correspond to a first series of linear structures that extends along a first direction, and that the digit lines 1112 may correspond to a second series of linear structures that extends along a second direction which is substantially orthogonal to the first direction (with the term "substantially orthogonal" meaning orthogonal to within reasonable tolerances of fabrication and measurement). The digit lines 1112 are shown in dashed-line (phantom) view in FIG. 2A to indicate that they are beneath the wordlines 1114.

It is noted that FIG. 2 shows an example wordline 1114 bifurcated into two segments that are on opposing sides of the semiconductor pillar 1104. In other applications the wordlines may have other configurations, including, for example, gate-all-around configurations, wordline-along-only-one-side-of-a-semiconductor-pillar configurations, etc. FIG. 2A shows the wordlines 1114 in a simplified configuration in which each wordline comprises a single segment, rather than the bifurcated segments of FIG. 2. It is to be understood, however, that the simplified configuration of FIG. 2A may be generically representative of any suitable wordline configuration, including, for example, the bifurcated-segment-configuration of FIG. 2.

The memory cells 1110 are not shown in FIG. 2A in order to simplify the drawing. However, it is to be understood that each memory cell would be uniquely addressed by one of the digit lines 1112 in combination with one of the wordlines 1114. In practice, the memory configuration 1100 may correspond to a memory array comprising hundreds, thousands, hundreds of thousands, millions, hundreds of millions, etc., of the memory cells 1110, and comprising suitable numbers of the digit lines 1112 and the wordlines 1114. The digit lines 1112 and wordlines 1114 of FIG. 2A may be understood to extend in generally horizontal directions, with the wordlines 1114 extending along an illustrated x-axis direction, and the digit lines 1112 extending along an illustrated y-axis direction.

FIG. 2B shows a portion of the memory region 1100 along a cross-sectional side view, with the wordlines 1114 being illustrated in isolation from the digit lines 1112. The individual wordlines 1114 are shown as single segments in FIG. 2B similarly to the representation utilized in FIG. 2A.

The wordlines 1114 are supported over a base 1116. Such base may comprise insulative material, and in some embodiments may comprise insulative material over a semiconductor substrate (with the term "semiconductor substrate" being defined below relative to FIG. 4). The base 1116 extends in a generally horizontal direction. The wordlines 1114 also extend in a generally horizontal direction, with such direction being in and out of the page relative to the view of FIG. 2B. In some applications, the wordlines 1114 of FIG. 2B may be considered to be in a planar orientation, in that the wordlines are all along substantially the same horizontal plane as one another.

Another example memory configuration 1200 is shown in FIG. 3. Transistors (access devices) 1206 include horizontally-extending segments of semiconductor material 1204, with such segments including source/drain regions 1238 and 1240, and including channel regions 1242. Capacitors 1208 are coupled with the transistors 1206 through conductive interconnects 1244. In some applications, the conductive interconnects may be considered to be part of the capacitors, and may, for example, be considered to be part of the storage nodes of such capacitors.

Memory cells 1210 comprise the transistors 1206 and the capacitors 1208. The memory cells are arranged within the memory configuration (memory array) 1200, with such array having rows 1224 extending along an illustrated z-axis direction, and having columns 1246 extending along an illustrated x-axis direction. Digit lines 1212 extend along the columns 1246, and are coupled with the source/drain regions 1238 of the transistors 1206. Wordlines 1214 extend along the rows 1224 of the memory array, and are adjacent to the channel regions 1242 of the transistors 1206. In the illustrated embodiment, each of the wordlines comprises two segments, with such segments being on opposing sides of the channel regions 1242. In other embodiments, the wordlines may comprise other suitable configurations, and may, for example, comprise only a single component on one side of a channel region, may comprise gate-all-around configurations, etc.

The wordlines 1214 may be spaced from the channel regions 1242 by gate dielectric material analogous to the material 1105 of FIG. 2, but such gate dielectric material is not shown in FIG. 3 in order to simplify the drawing.

The body regions (channel regions) 1242 of the transistors 1206 are coupled with a conductive plate 1248. Such plate may be utilized to enable excess carriers (e.g., holes) to drain from the body regions 1242 during some operational modes of the memory cells 1210.

FIG. 4 shows a cross-sectional side view of the assembly 1200 of FIG. 3 along the y-axis direction, and diagrammatically illustrates some of the structures described above with reference to FIG. 3. The transistors 1206 are shown to extend horizontally along the y-axis direction. The wordlines 1214 are shown to extend vertically along a z-axis direction, and the digit lines 1212 are shown to extend horizontally in and out of the page relative to the cross-sectional view of FIG. 4. The conductive plates 1248 (FIG. 3) are not shown in FIG. 4 in order to simplify the drawing.

The capacitors 1208 of laterally neighboring memory cells 1210 are shown to share a plate electrode 1250 in the memory configuration 1200 of FIG. 4.

A base 1216 supports components of the memory configuration 1200. Such base may comprise semiconductor material; and may, for example, comprise, consist essentially of, or consist of monocrystalline silicon. The base 1216 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 1216 may correspond to a semiconductor substrate containing one or more materials associated with integrated circuit fabrication. Such materials may include, for example, one or more of refractory metal materials, barrier materials, diffusion materials, insulator materials, etc.

Another example memory configuration 1300 is shown in FIG. 5. Transistors (access devices) 1306 include horizontally-extending segments of semiconductor material 1304, with such segments including source/drain regions 1338 and 1340, and including channel regions 1342. Capacitors 1308 are coupled with the transistors 1306 through conductive interconnects 1344. In some applications, the conductive interconnects may be considered to be part of the capacitors, and may, for example, be considered to be part of the storage nodes of such capacitors.

Memory cells 1310 comprise the transistors 1306 and the capacitors 1308. The memory cells are arranged within the memory configuration (memory array) 1300. Digit lines 1312 extend along columns of the memory array and are coupled with the source/drain regions 1338 of the transistors 1306. The digit lines extend vertically along a z-axis direction.

Wordlines 1314 extend along the rows of the memory array, and are adjacent to the channel regions 1342 of the transistors 1306. The wordlines 1314 are spaced from the channel regions 1342 by gate dielectric material 1305.

The body regions (channel regions) 1342 of the transistors 1306 are coupled with a conductive plate 1348. Such plate may be utilized to enable excess carriers (e.g., holes) to drain from the body regions 1342 during some operational modes of the memory cells 1310.

FIG. 6 shows a cross-sectional side view of the assembly 1300 of FIG. 5 along the x-axis direction, and diagrammatically illustrates some of the structures described above with reference to FIG. 5. The transistors 1306 are shown to extend horizontally along the x-axis direction. The digit lines 1312 are shown to extend vertically along a z-axis direction, and the wordlines 1314 are shown to extend horizontally in and out of the page relative to the cross-sectional view of FIG. 6.

The capacitors 1308 of laterally neighboring memory cells 1310 are shown to share a plate electrode 1350.

The illustrated components of the memory configuration 1300 are shown to be supported by a base 1316. Such base may be a semiconductor substrate.

A continuing goal during the fabrication of integrated assemblies is to increase packing density and to thereby conserve valuable semiconductor real estate. It is desired to develop improved reference-voltage-generators which may be packed into a tighter footprint than conventional reference-voltage-generators.

BRIEF DESCRIPTION OF THE DRAWINGS

FIG. 2 is a diagrammatic cross-sectional side view of a region of a prior art assembly comprising a prior art memory cell. FIG. 2A is a diagrammatic top-down view of a region of a prior art assembly comprising a prior art arrangement of wordlines and digit lines. FIG. 2B is a diagrammatic cross-sectional side view of a region of a prior art assembly comprising an arrangement of wordlines.

FIG. 11 is a diagrammatic top-down view of a region of an example integrated assembly.

FIG. 11A is a diagrammatic side view of a region of an example integrated assembly similar to that of FIG. 11.

DETAILED DESCRIPTION OF THE ILLUSTRATED EMBODIMENTS

Some embodiments include reference-voltage-generators configured to be incorporated into integrated assemblies. Example embodiments are described with reference to FIGS. 7-16.

In some embodiments, a memory region (memory array) may be considered to comprise memory cells, and to comprise sense/access lines configured for addressing the memory cells (where the term "sense/access line" is generic for wordlines and digit lines). A reference-voltage-generator may be formed proximate to the memory region, and may utilize resistive units that match sense/access lines of the memory array. Accordingly, the resistive units may be advantageously formed and patterned during the forming and patterning of the sense/access lines, which may simplify fabrication of the reference-voltage-generator and thereby save time and costs as compared to conventional methods of fabricating reference-voltage-generators. Further, the reference-voltage-generators described herein may be highly-integrated into integrated assemblies, thereby conserving valuable semiconductor real estate.

Figure 7:
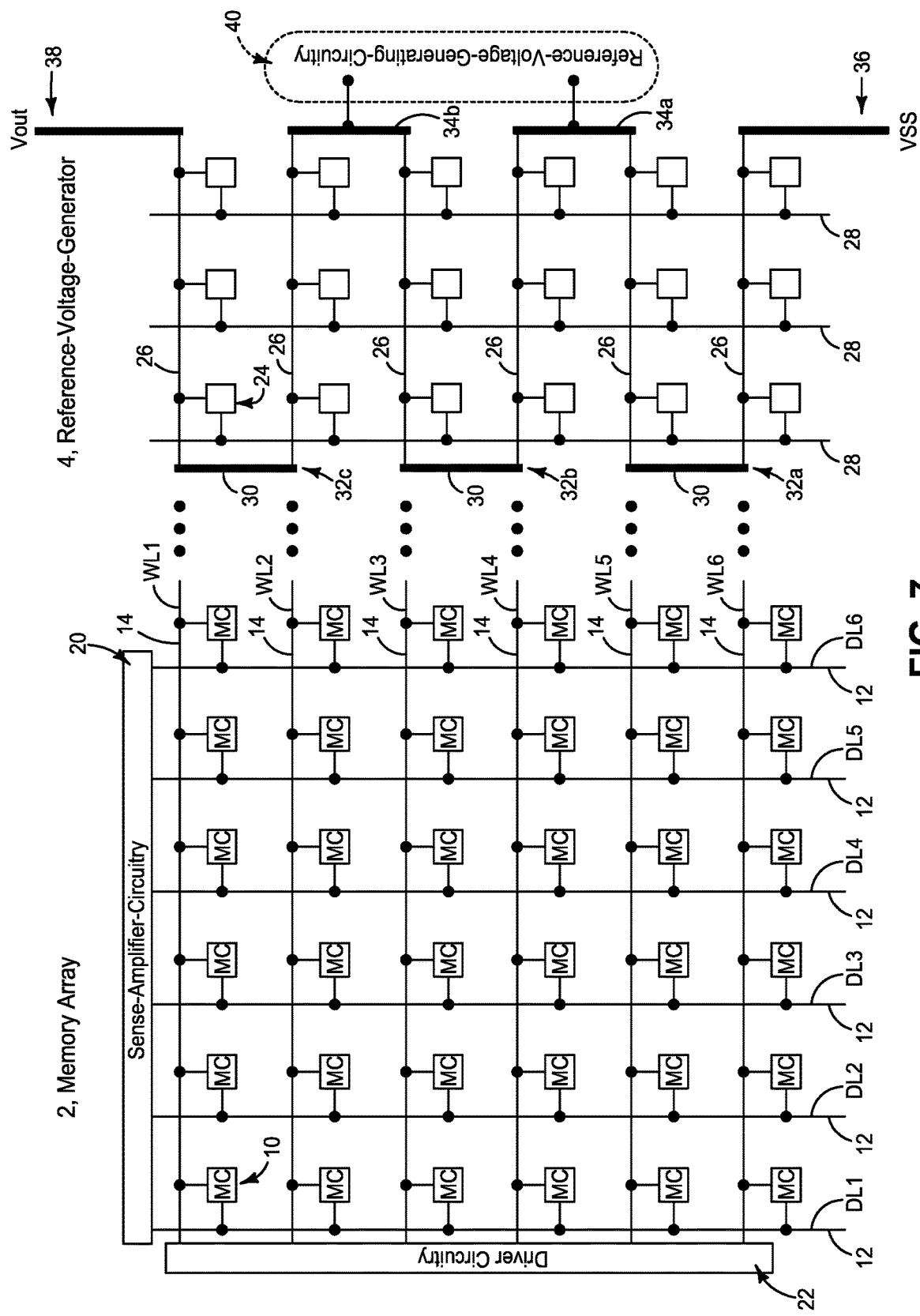
FIG. 7 is a diagrammatic schematic view of a region of an example integrated assembly.
Figure 8:
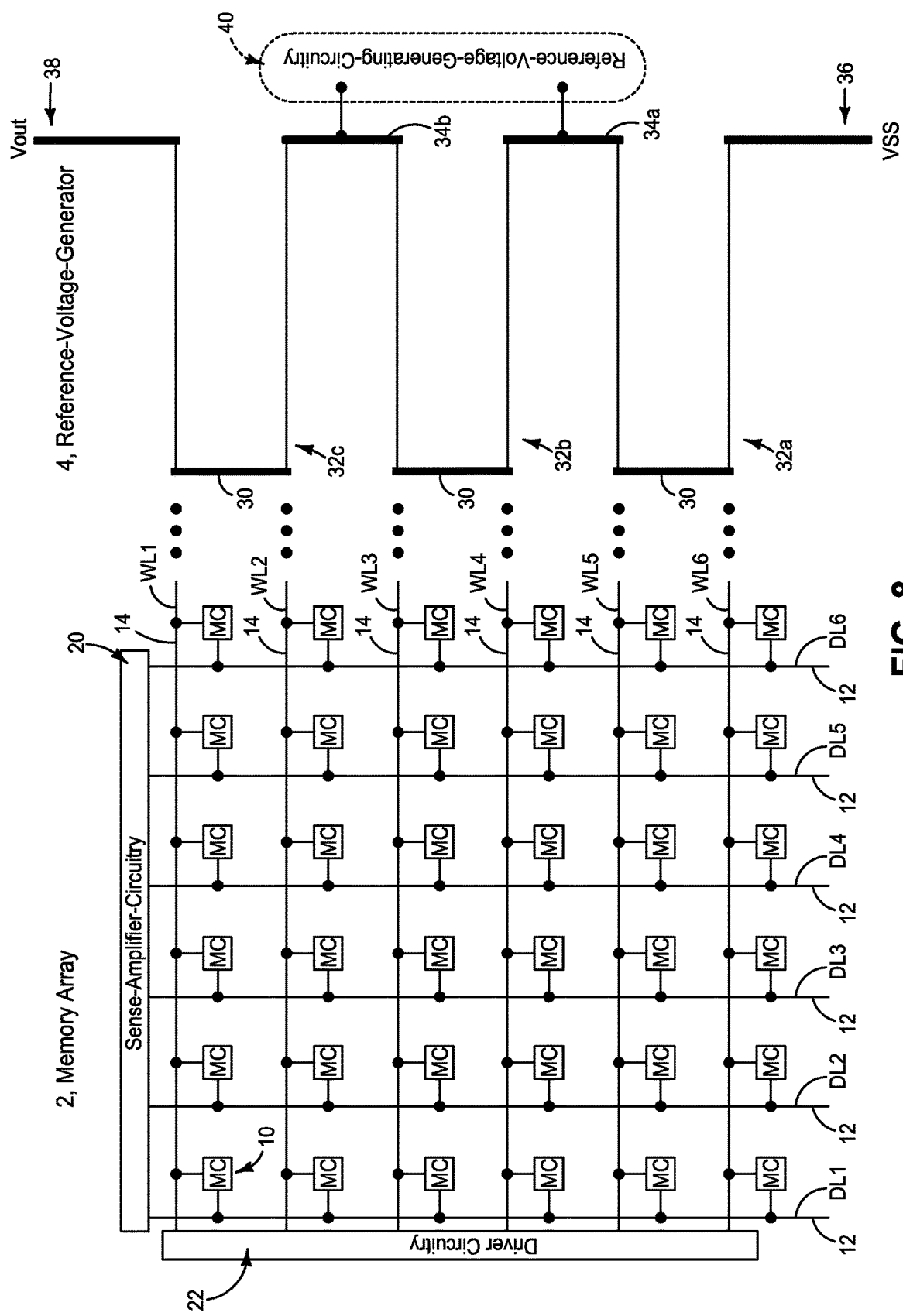
FIG. 8 is a diagrammatic schematic view of a region of an example integrated assembly.
Figure 9:
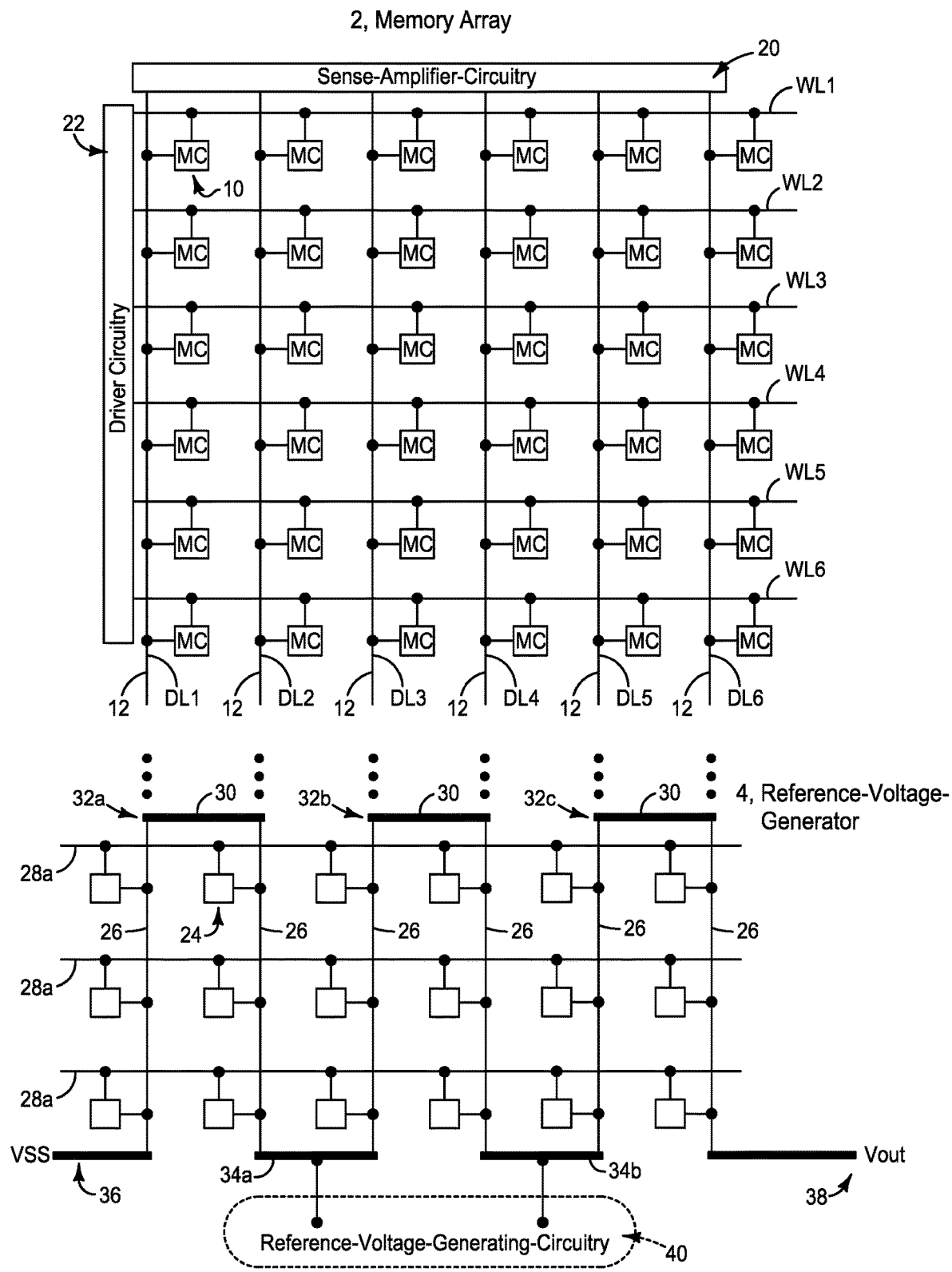
FIG. 9 is a diagrammatic schematic view of a region of an example integrated assembly.
Figure 10:
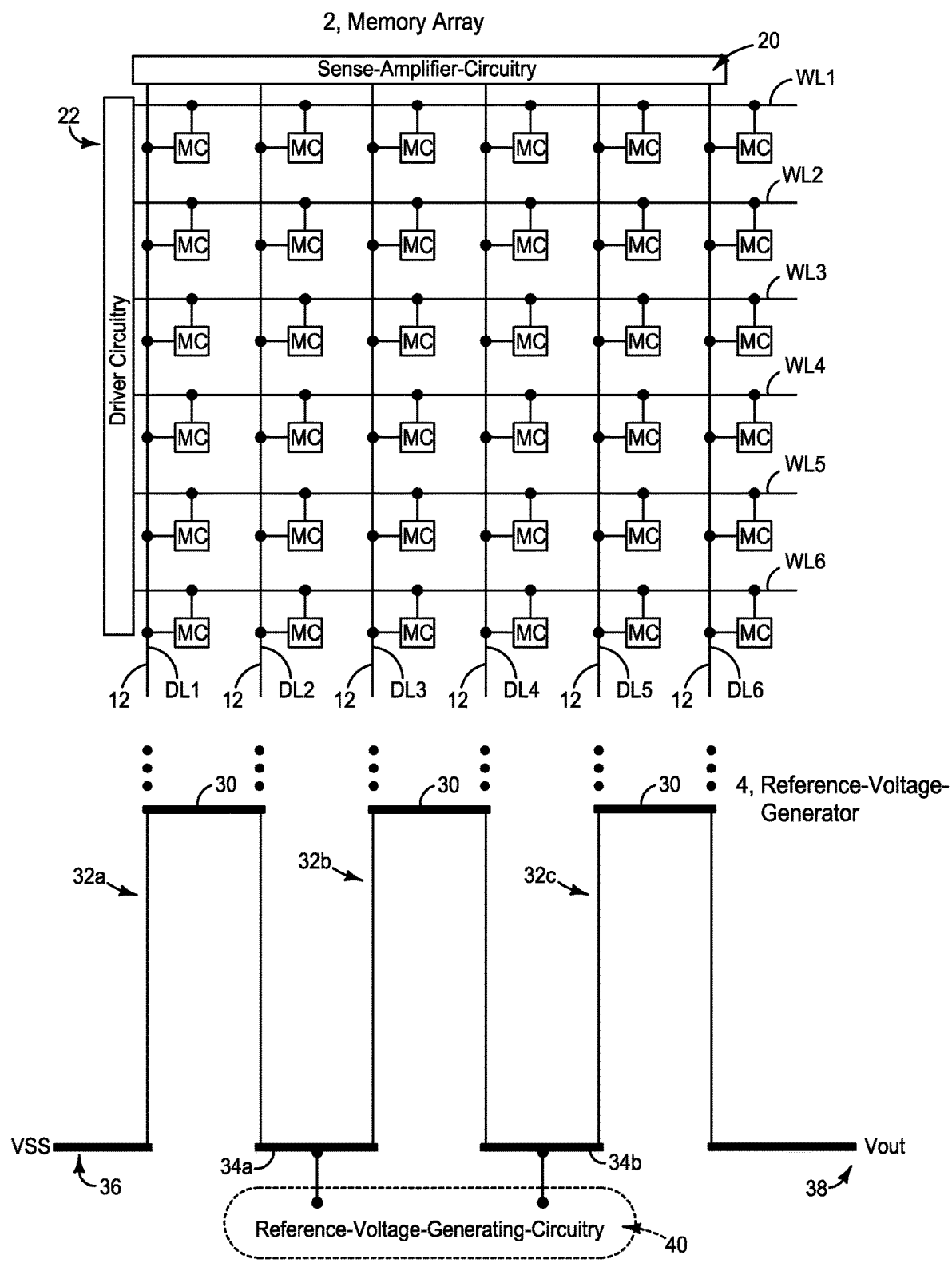
FIG. 10 is a diagrammatic schematic view of a region of an example integrated assembly.

FIGS. 7-10 illustrate example applications in which resistive units of a reference-voltage-generator match sense/access lines of a memory array (i.e., in which the resistive units of a reference-voltage-generator are configured to be substantially identical to the sense/access lines), with FIGS. 7 and 8 illustrating example applications in which the resistive units of the reference-voltage-generator match wordlines of a memory array, and with FIGS. 9 and 10 illustrating example applications in which the resistive units of the reference-voltage-generator match digit lines of the memory array.

Referring to FIG. 7, a reference-voltage-generator 4 is shown to be formed proximate to a memory array 2 within an integrated assembly.

The memory array 2 includes memory cells (MC) 10, and includes digit lines 12 and wordlines 14 configured for addressing the memory cells. Each of the memory cells 10 is uniquely addressed utilizing one of the wordlines 14 and one of the digit lines 12. In the illustrated embodiment, the wordlines are labeled as WL1-WL6, and the digit lines are labeled as DL1-DL6. The illustrated memory cells, digit lines and wordlines may be representative of a large number of memory cells, digit lines and wordlines associated the memory array 2. For instance, the memory array may comprise thousands, hundreds of thousands, millions, hundreds of millions, etc., of the memory cells 10; and may accordingly also comprise thousands, hundreds of thousands, millions, hundreds of millions, etc., of the digit lines 12 and the wordlines 14.

The digit lines 12 are coupled with sensing circuitry 20 (e.g., sense-amplifier-circuitry), and the wordlines 14 are coupled with driver circuitry 22.

The reference-voltage-generator 4 is shown to comprise resistive units 26 which are aligned with the wordlines 14 of the memory array. The resistive units 26 may be fabricated simultaneously with the wordlines 14, and may be configured substantially identically to the wordlines 14. For instance, the resistive units 26 may comprise the same composition(s), thickness, height, etc., as the wordlines 14. The common composition(s) of the resistive units 26 and the wordlines 14 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The resistive units 26 may differ in length relative to the wordlines 14, and the lengths of the resistive units 26 may be tailored to achieve desired resistances within such resistive units.

In the embodiment of FIG. 7, structures 24 are associated the resistive units 26, with such structures being substantially identical to the memory cells 10 of the memory array 2 (e.g., the structures 24 may comprise capacitors). The structures 24 are not utilized as memory cells, but may be fabricated together with the memory cells 10 if such simplifies a fabrication process during formation of the reference-voltage-generator 4 and the memory array 2. Also, structures 28 are associated the reference-voltage-generator 4, with such structures being substantially identical to the digit lines 12 of the memory array. The structures 28 are not utilized as digit lines, but may be fabricated together with the digit lines 12 if such simplifies a fabrication process during formation of the reference-voltage-generator 4 and the memory array 2.

Pairs of the resistive units 26 are shown to be coupled to one another in series through conductive interconnects 30. The paired resistive units together form resistive components 32 (in other embodiments (not shown), at least some of the resistive components 32 may comprise more than two of the resistive units). The illustrated embodiment comprises three of such resistive components, which may be referred to as a first resistive component 32a, a second resistive component 32b, and a third resistive component 32c. The first and second resistive components 32a and 32b are coupled to one another in series through a conductive interconnect 34a, and the second and third resistive components 32b and 32c are coupled to one another in series through a conductive interconnect 34b. In some embodiments, the conductive interconnects 34a and 34b may be referred to as first and second conductive interconnects, respectively. Such conductive interconnects are coupled with reference-voltage-generating-circuitry 40. Example configurations of the reference-voltage-generating-circuitry are described below with reference to FIGS. 12 and 13.

The reference-voltage-generator 4 of FIG. 7 is shown to be coupled with a first voltage-supply-terminal 36 and a second voltage-supply-terminal 38. In the shown embodiment, the voltage-supply-terminals are at voltages corresponding to VSS and Vout, respectively. Persons of ordinary skill may readily determine suitable voltages for VSS and Vout for intended applications.

FIG. 8 shows a configuration similar to that of FIG. 7, but the structures 24 and 28 are omitted from the reference-voltage-generator 4. The embodiment of FIG. 8 may save materials as compared to the embodiment of FIG. 7 (and may thereby save costs of such materials), and may be a preferred embodiment relative to that of FIG. 7 provided that the costs associated with additional complexities (e.g., additional masking steps, etc.) introduced during fabrication of the embodiment of FIG. 8 are offset by the savings associated the reduced costs of materials.

FIG. 9 shows another example embodiment in which a reference-voltage-generator 4 is formed proximate to a memory array 2. The embodiment of FIG. 9 differs from that of FIG. 7 in that the resistive units 26 of FIG. 9 are substantially identical to the digit lines 12 of the memory array rather than being substantially identical to the wordlines 14. The configuration of FIG. 9 includes the additional structures 24 described above with reference to FIG. 7, and includes additional structures 28a analogous to the structures 28 of FIG. 7; except that the structures 28a of FIG. 9 match the wordlines 14 of the memory array while the structures 28 of FIG. 7 match the digit lines 12 of the memory array.

The resistive units 26 may be fabricated simultaneously with the digit lines 12, and may be configured substantially identically to the digit lines 12. For instance, the resistive units 26 may comprise the same composition(s), thickness, height, etc., as the digit lines 12. The common composition(s) of the resistive units 26 and the digit lines 12 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

FIG. 10 shows an embodiment similar to that of FIG. 9, except that the additional structures 24 and 28a are omitted from the reference-voltage-generator 4.

The memory arrays 2 of FIGS. 7-10 may be, for example, dynamic random-access memory (DRAM) arrays, ferroelectric random-access memory (FeRAM) arrays, etc. The reference-voltage-generators 4 of FIGS. 7-10 may be in any suitable location relative to the associated memory arrays 2, and may be, for example, laterally offset from the memory arrays and/or vertically offset from the memory arrays.

FIGS. 11 and 11A illustrate an example application in which a reference-voltage-generator 4 is configured to include resistive units 26 which are substantially identical to sense/access lines of the memory array 1100 of FIGS. 2-2B (e.g., which are substantially identical to the wordlines 1114 of the memory array). FIG. 11 is a diagrammatic top-down view of the reference-voltage-generator 4, and FIG. 11A is a diagrammatic cross-sectional side view along the line A-A of FIG. 11. As described above, the memory array 1100 of FIGS. 2-2B may be considered to have sense/access lines (e.g., wordlines 1114) extending primarily horizontally relative to an underlying supporting base 1116. Since the resistive units 26 of the reference-voltage-generator 4 of FIGS. 11 and 11A match the sense/access lines (e.g., wordlines 1114) of the memory array 1100, such resistive units may also extend primarily horizontally relative to the underlying supporting base. The resistive units 26 of FIGS. 11 and 11A are shown to extend primarily along an illustrated y-axis; and such y-axis may correspond to either the x-axis or the y-axis of FIG. 2A, depending on whether the resistive units 26 of FIGS. 11 and 11A match the digit lines 1112 or the wordlines 1114 of FIG. 2A.

The embodiment of FIGS. 11 and 11A shows paired resistive units incorporated into resistive components 32a-32e. The paired resistive units 26 are coupled to one another through conductive interconnects 30, and the resistive components 32a-32e are coupled to one another in series through conductive interconnects 34a-34d. The conductive interconnects 34a-34d are coupled with reference-voltage-generating-circuitry 40.

The conductive interconnects 30 and 34 may be in any suitable locations relative to the resistive components 26. In some embodiments, the resistive components may extend laterally, and the conductive interconnects 30 and 34 may be laterally outward of such conductive interconnects, as is diagrammatically illustrated in FIG. 11. Alternatively, the conductive interconnects 30 may be provided over the laterally-extending resistive units 26 (as is diagrammatically illustrated in FIG. 11A) and/or the conductive interconnects 34 may be provided under the laterally-extending resistive units 26 (as is diagrammatically illustrated in FIG. 11A). The reference-voltage-generating-circuitry 40 may comprise components laterally outward of the laterally-extending resistive units 26 and/or may comprise components vertically-offset from the laterally-extending resistive units 26 (e.g., directly under regions of such laterally-extending resistive units).

The voltage-reference-generator 4 of FIGS. 11 and 11A is shown to comprise the supply terminals 36 and 38 described above with reference to FIGS. 7-10. Such supply terminals may be at any suitable voltages.

The reference-voltage-generating-circuitry 40 may comprise any suitable configuration. Example configurations are described with reference to FIGS. 12 and 13.

Figure 1:
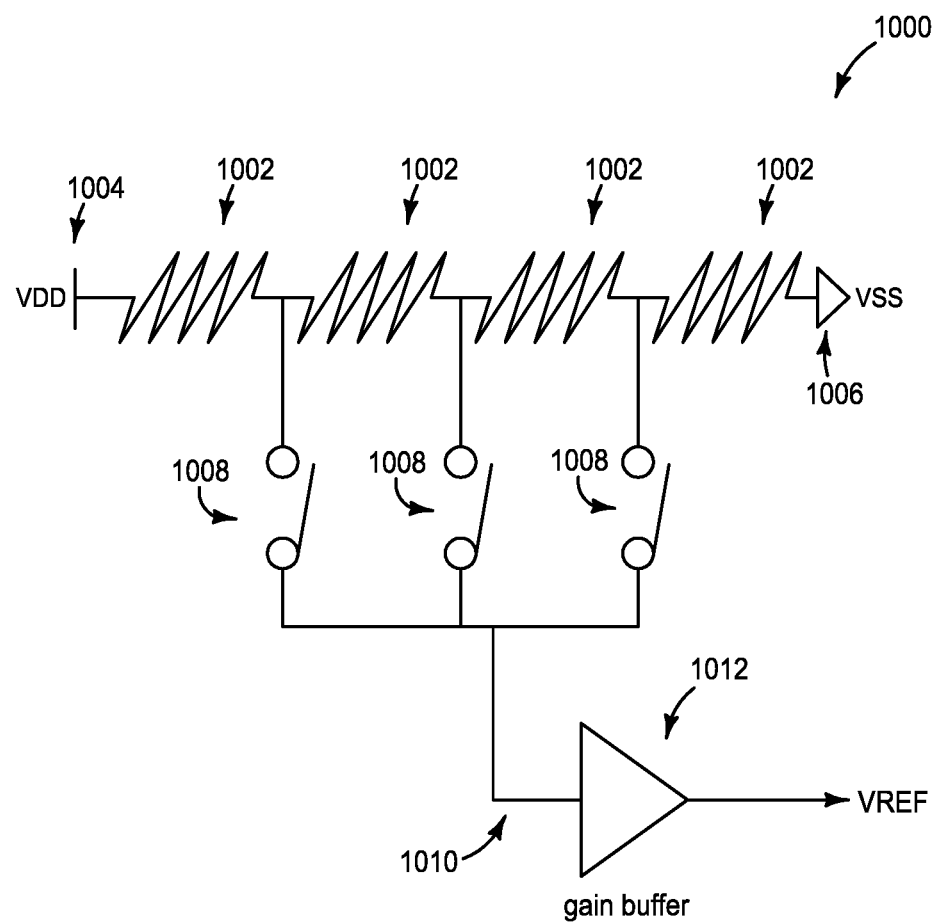
FIG. 1 is a schematic diagram of a prior art reference-voltage-generator.
Figure 3:
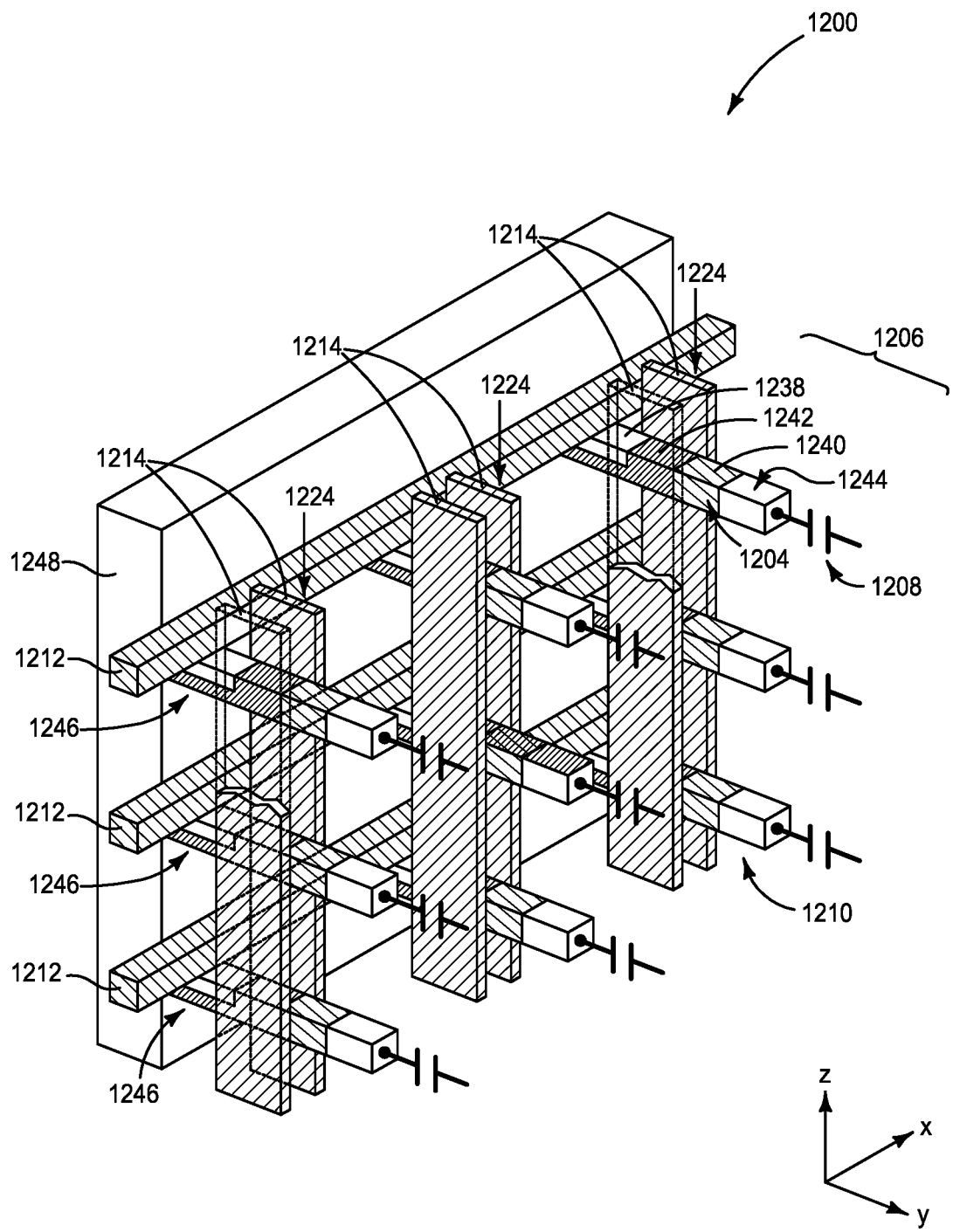
FIG. 3 is a diagrammatic three-dimensional view of a region of a prior art integrated assembly.
Figure 12:
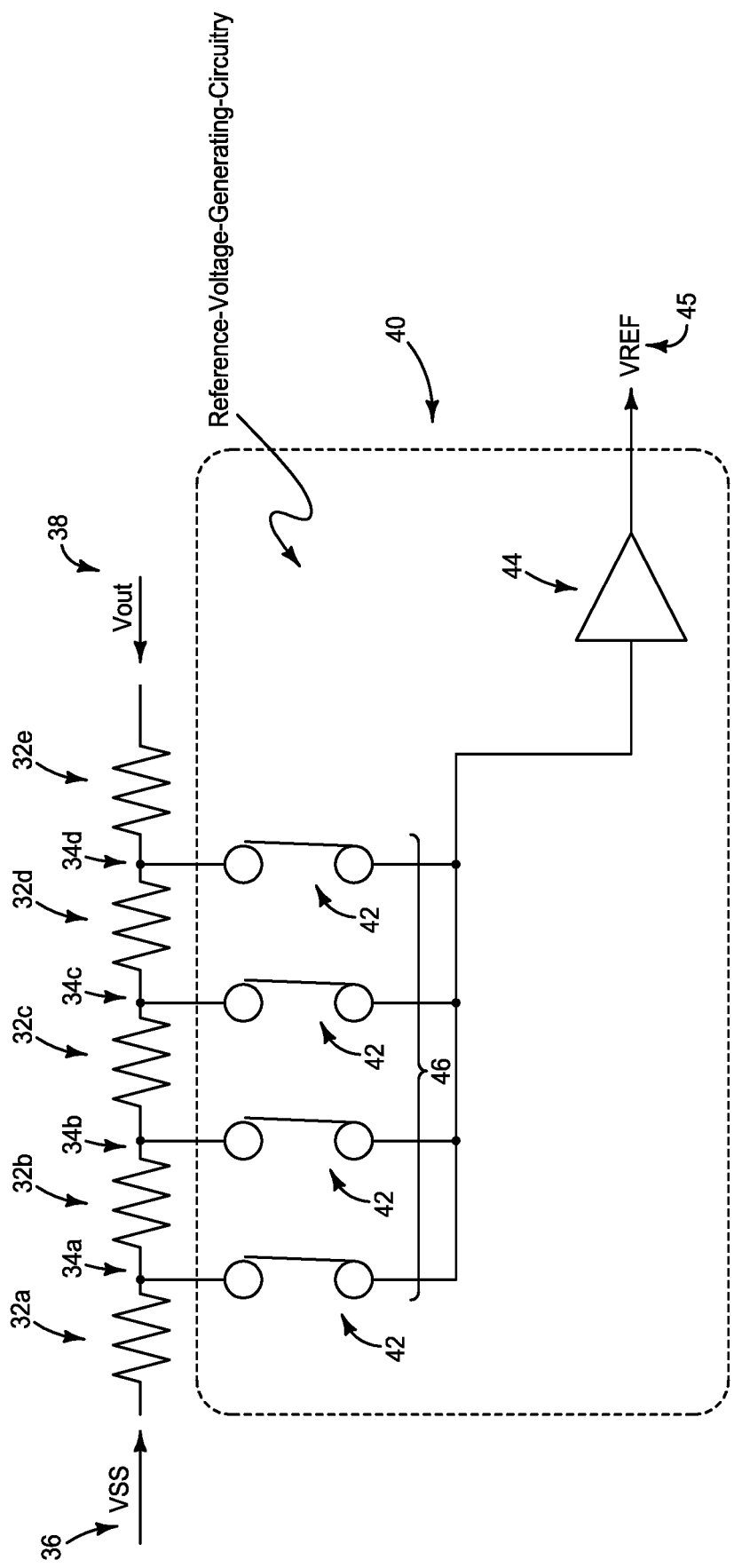
FIG. 12 is a diagrammatic schematic view of a region of an example reference-voltage-generator.

Referring to FIG. 12, the reference-voltage-generating-circuitry 40 has a configuration similar to that described above with reference to FIG. 1. Specifically, the circuitry 40 comprises a plurality of switches 42 which are coupled to a gain buffer 44, and the reference voltage (VREF) is an output from the gain buffer (with the reference voltage output being labeled 45). The switches 42 may be considered together as switching circuitry 46 configured to selectively couple the interconnects 34a-34d with the reference voltage output 45.

The switching circuitry 46 may be provided in any suitable location relative to the resistive components 32a-32e, and in some embodiments may be beneath the resistive components, laterally offset relative to the resistive components, etc.

Figure 13:
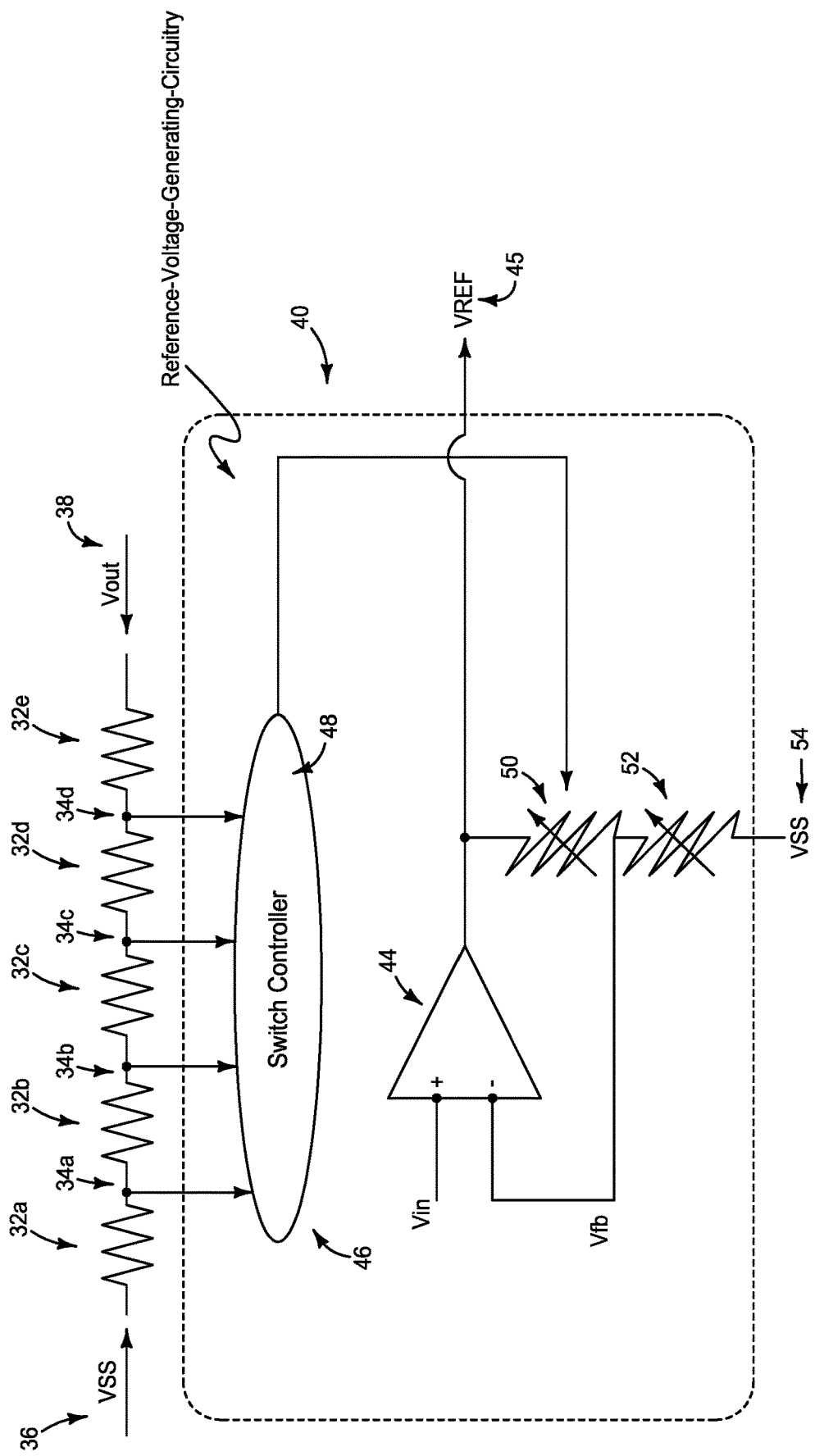
FIG. 13 is a diagrammatic schematic view of a region of another example reference-voltage-generator.

Referring to FIG. 13, the switching circuitry 46 may correspond to a switch controller 48 which is effectively utilized as a variable resistor 50 coupled with a reference voltage output 45. In the illustrated embodiment, the variable resistor 50 is provided in series with another variable resistor 52, which is coupled with a supply terminal 54. The supply terminal 54 is shown to provide VSS voltage. A gain buffer 44 is coupled with the variable resistors 50 and 52. A feedback voltage (Vfb) extends from a negative terminal of the gain buffer to a node coupled with the variable resistors 50 and 52, and an input voltage (Vin) is coupled with a positive terminal of the gain buffer. The input voltage and feedback voltage may be readily determined by persons of ordinary skill.

The switching circuitry 46 of FIG. 13 may be provided in any suitable location relative to the resistive components 32a-32e, and in some embodiments may be beneath the resistive components, laterally offset relative to the resistive components, etc.

The example configurations of FIGS. 12 and 13 are for illustrative purposes only, and are provided to convey example components of example reference-voltage-generating-circuitry to the reader. It is to be understood that other configurations may be utilized and/or that the configurations of FIGS. 12 and 13 may be modified to be adapted for particular applications. Further, it is noted that the VREF of FIG. 13 may be at a same voltage as Vout and may be considered to be electrically coupled to Vout (or even shorted to Vout) in some applications.

The resistive units 26 of FIGS. 11 and 11A were described as extending primarily horizontally relative to an underlying base. In other embodiments, the resistive units may extend primarily vertically relative to an underlying base. Such embodiments may be associated with memory arrays of the types described above with reference to FIGS. 3-6.

Figure 14:
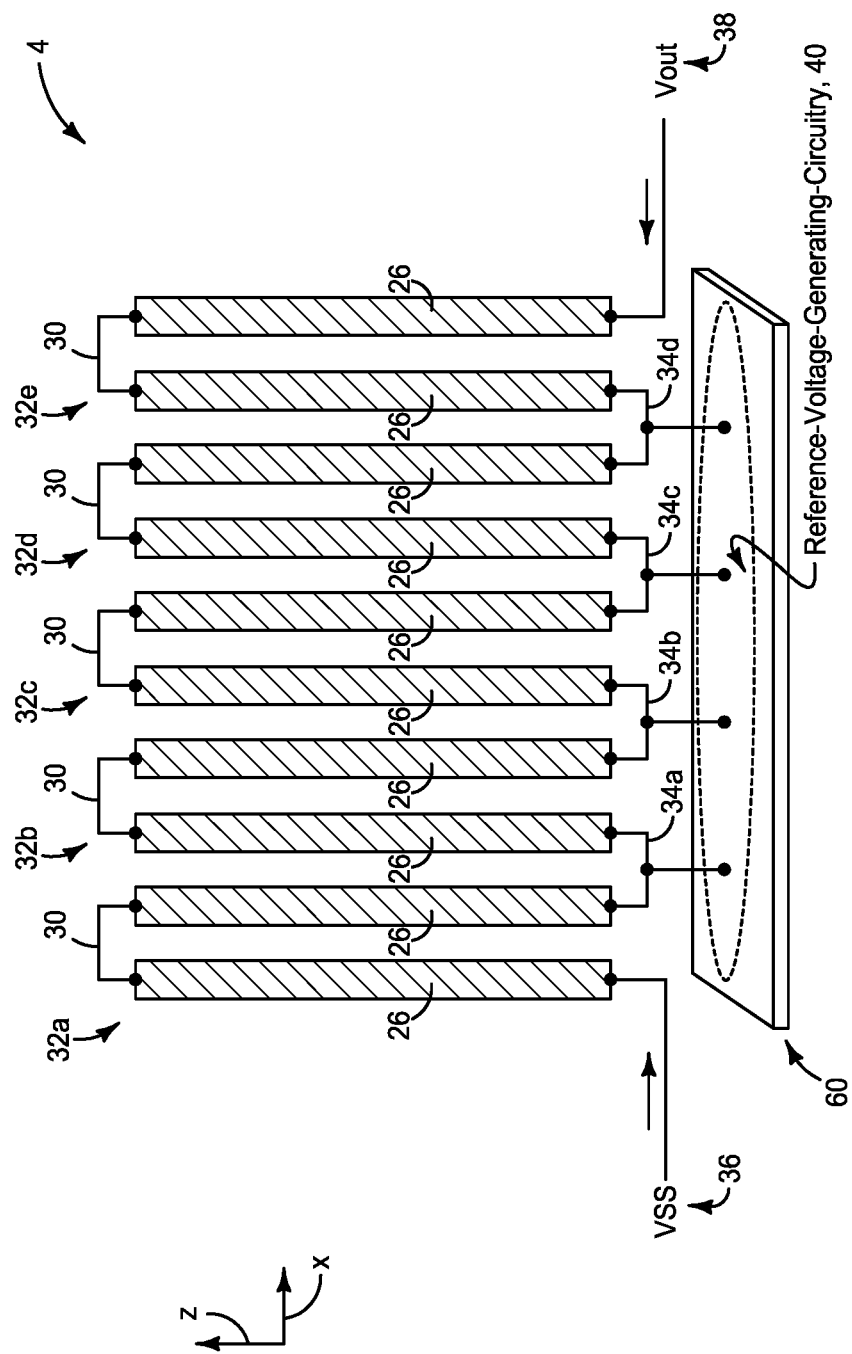
FIG. 14 is a diagrammatic side view of a region of an example integrated assembly.

FIG. 14 diagrammatically illustrates a reference-voltage-generator 4 similar to that described above with reference to FIG. 11, except that the resistive units 26 extend along a vertical z-axis, rather than along the lateral y-axis. The conductive interconnects 30 between the paired resistive units 26 may be over the resistive units 26, and the conductive interconnects 34a-34d may be beneath the resistive units. The reference-voltage-generating-circuitry 40 may be in any suitable location relative to the resistive units 26, and in some embodiments at least some of the reference-voltage-generating-circuitry 40 may be directly under the resistive units 26 and associated with a supporting base 60 analogous to the bases 1216 and 1316 described above with reference to the prior art.

Figure 4:
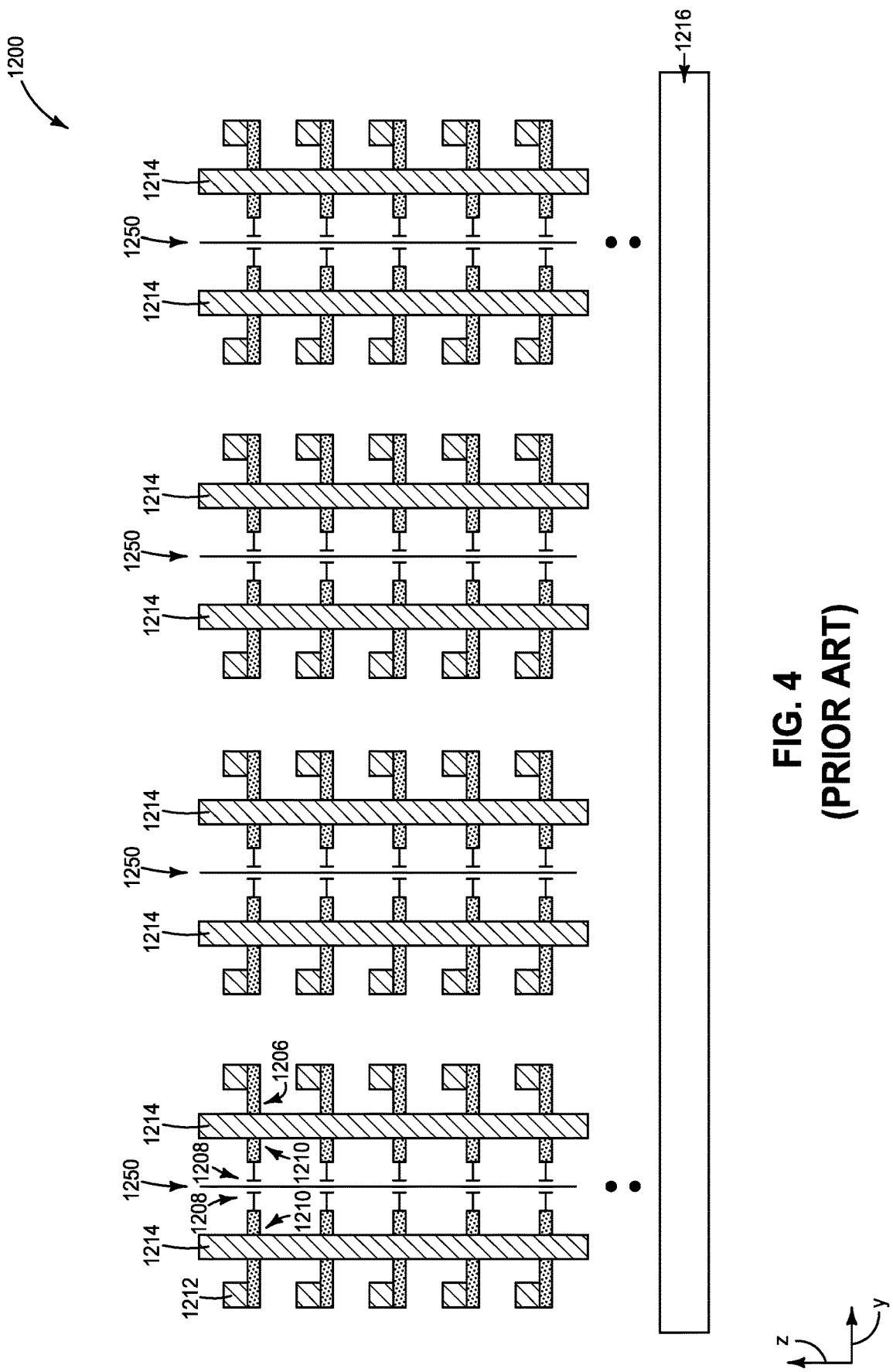
FIG. 4 is a diagrammatic cross-sectional side view of a region of a prior art assembly analogous to that of FIG. 3.
Figure 5:
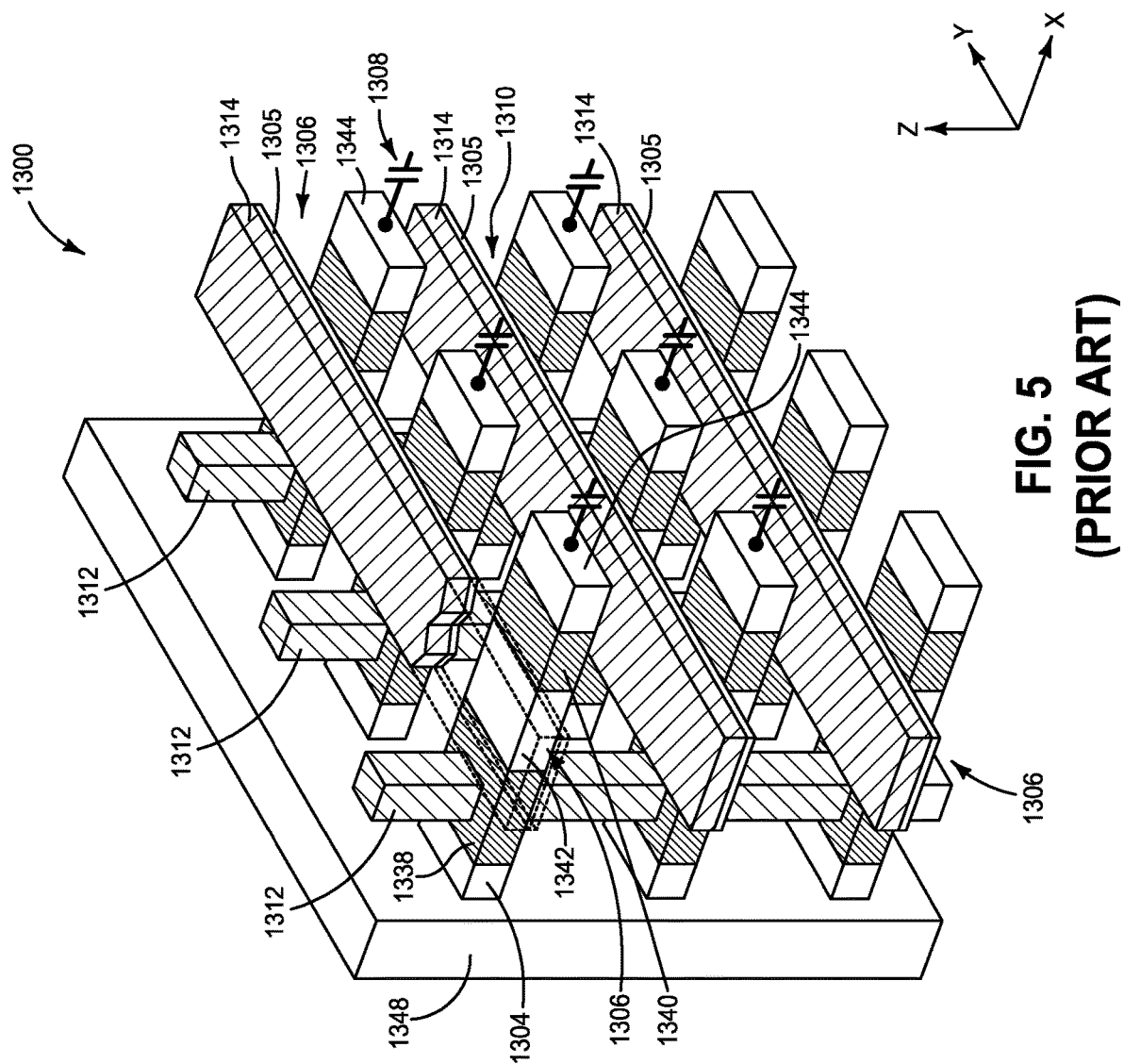
FIG. 5 is a diagrammatic three-dimensional view of a region of a prior art integrated assembly.
Figure 6:
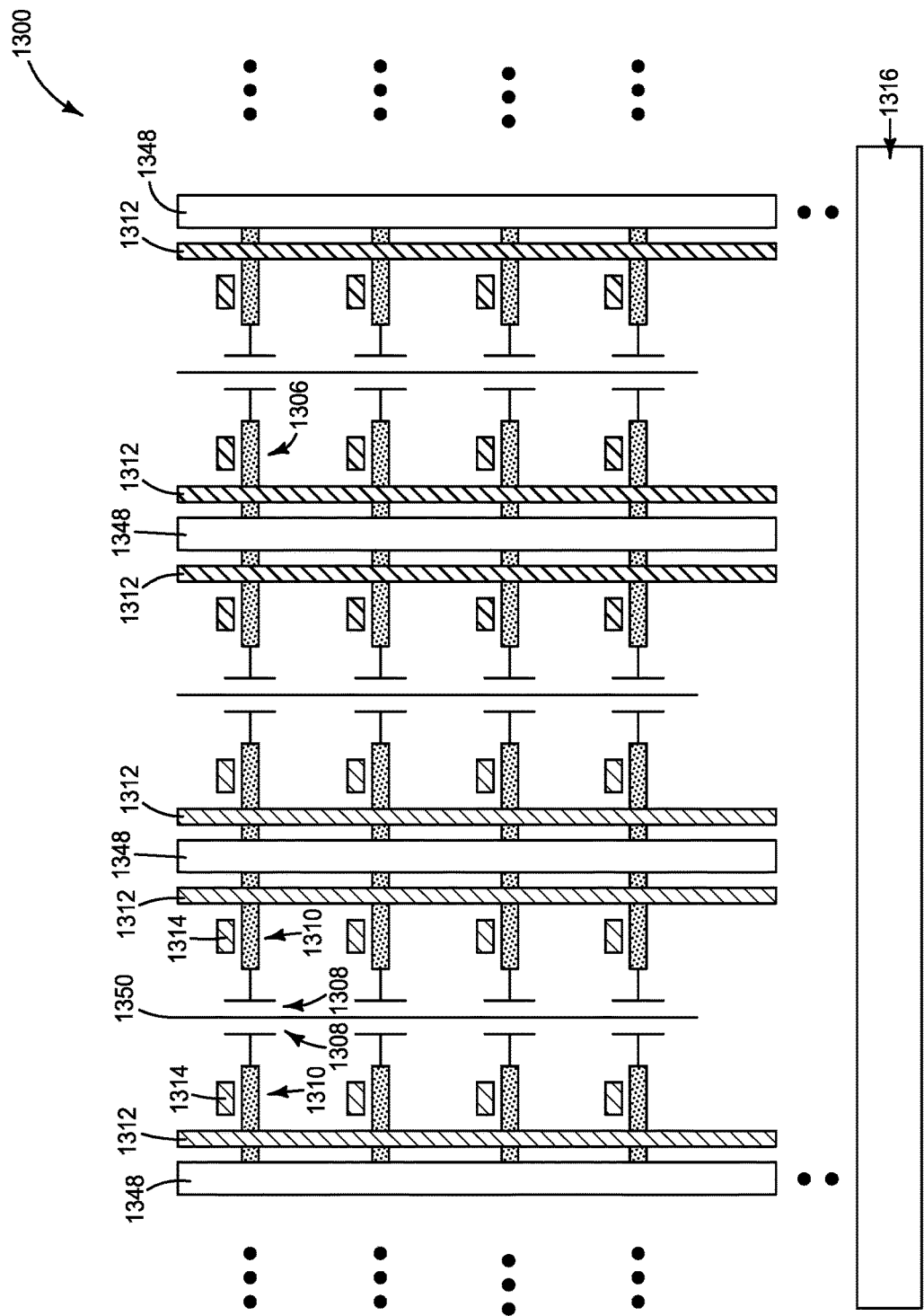
FIG. 6 is a diagrammatic cross-sectional side view of a region of a prior art assembly analogous to that of FIG. 5.
Figure 15:
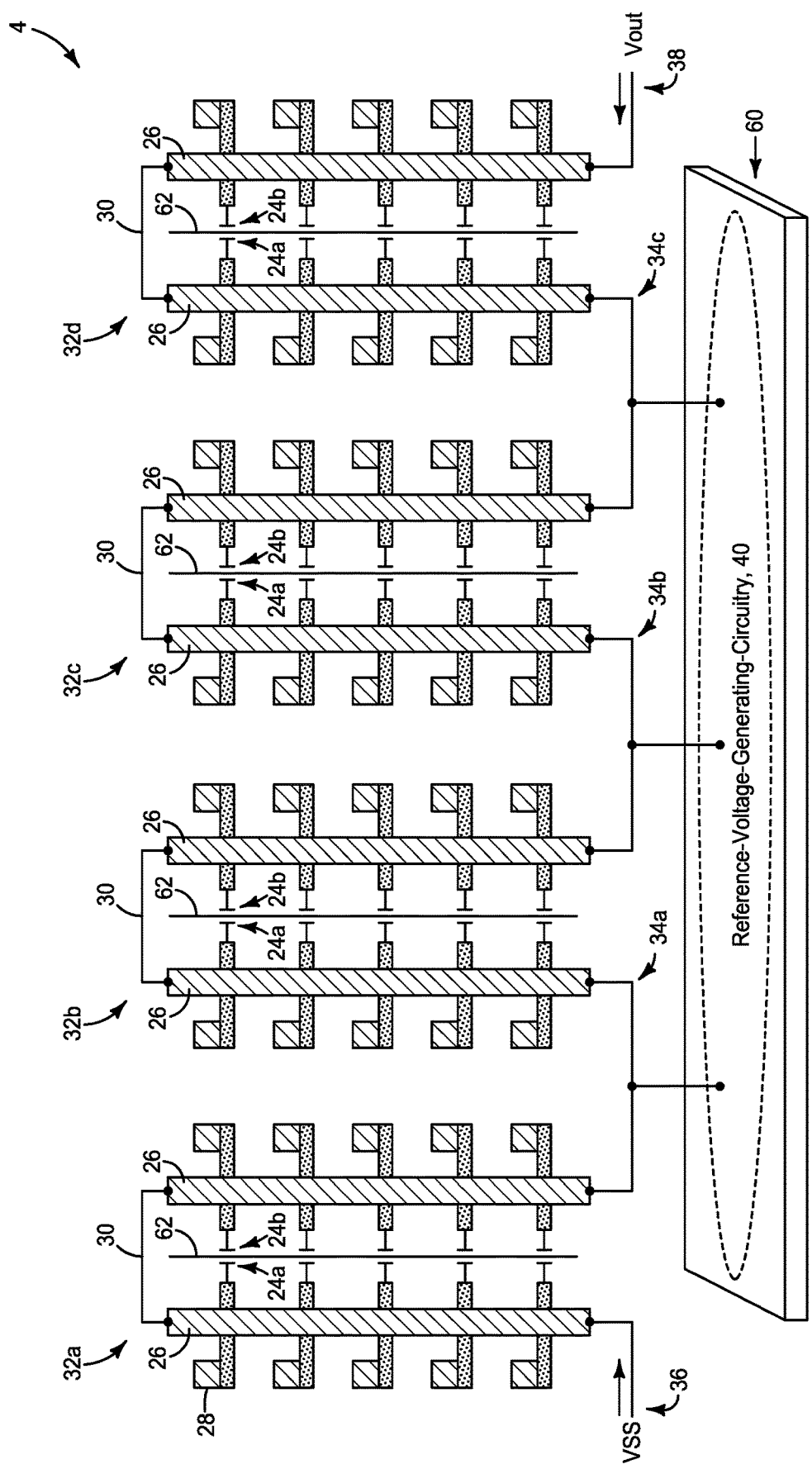
FIG. 15 is a diagrammatic side view of a region of an example integrated assembly.

The vertically-extending resistive units 26 may be substantially identical to wordlines associated a memory array (e.g., wordlines analogous to the wordlines 1214 of FIG. 4), or may be substantially identical to digit lines associated a memory array (e.g., digit lines analogous to the digit lines 1312 of FIG. 6). FIG. 15 shows a region of a reference-voltage-generator 4 in which the resistive units 26 are configured to be substantially identical to the vertically-extending wordlines 1214 of FIG. 4, and FIG. 16 shows a region of a reference-voltage-generator 4 in which the resistive units 26 are configured to be substantially identical to the vertically-extending digit lines 1312 of FIG. 6.

Figure 16:
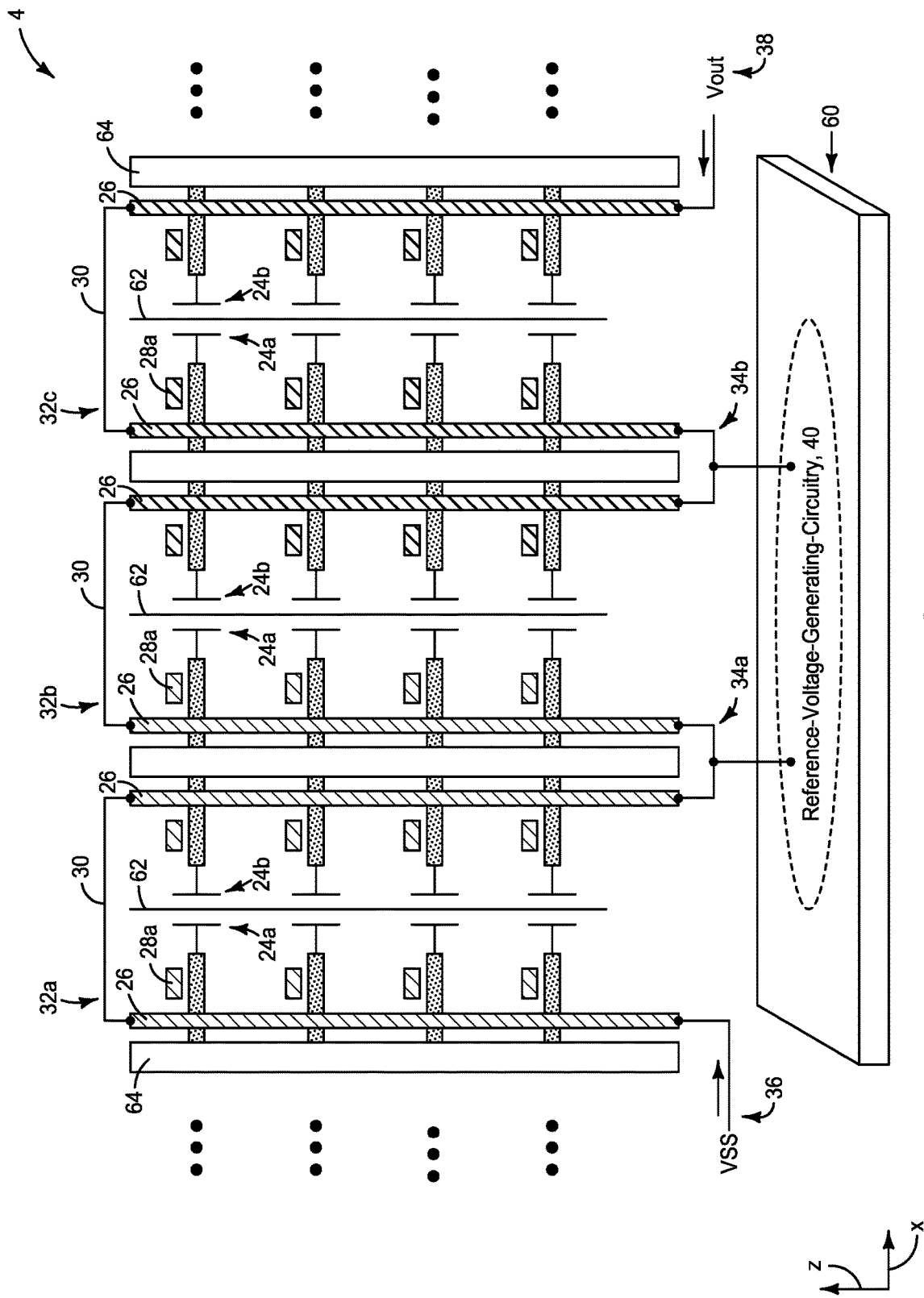
FIG. 16 is a diagrammatic side view of a region of an example integrated assembly.

Each of the reference-voltage-generators 4 of FIGS. 15 and 16 is shown to have structures 24 associated with the resistive units 26, with such structures being substantially identical to the memory cells of an associated memory array (e.g., the structures 24 may comprise capacitors analogous to those described above relative to the prior art of FIGS. 4 and 6). In the illustrated embodiments of FIGS. 15 and 16, the resistive units 26 extend vertically (or at least primarily vertically), and the capacitors within the structures 24 extend horizontally (or at least primarily horizontally). The term "primarily vertically" means that an overall indicated direction is more vertical than horizontal, and the term "primarily horizontally" means that an indicated direction is more horizontal than vertical. In some embodiments, the term "primarily vertically" may mean substantially vertically, where the term "substantially vertically" means vertically to within reasonable tolerances of fabrication and measurement; and the term "primarily horizontally" may mean substantially horizontally, where the term "substantially horizontally" means horizontally to within reasonable tolerances of fabrication and measurement.

In some embodiments, the structures 24 of FIGS. 15 and 16 (e.g., the shown horizontally-extending capacitors) may be considered to be arranged in sets within the resistive components 32. Specifically, a first set of structures 24a may be considered to be along one of the resistive units within a resistive component 32, and a second set of structures 24b may be considered be along the other of the resistive units within the resistive component 32. The structures 24a and 24b share a capacitor plate 62 between them in the shown embodiments of FIGS. 15 and 16.

It is noted that the embodiment of FIG. 16 shows conductive plates 64 within the reference-voltage-generator 4, with such conductive plates being analogous to the plates 1348 described above with reference to FIGS. 5 and 6. Similar plates may be within the reference-voltage-generator 4 of FIG. 15, with such plates being analogous to the plate 1248 of FIG. 3. Alternatively, the plates 64 of FIG. 16 may be omitted, and analogous plates may be omitted from the reference-voltage-generator of FIG. 15. Also, it is noted that the structures 24 and 28 may be omitted from the reference-voltage-generators of FIGS. 15 and 16 in some embodiments, analogously to the embodiments described above with reference to FIGS. 8 and 10.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not. The term "substantially vertical" means vertical to within reasonable tolerances of fabrication and measurement. In some embodiments, vertically-extending structures may extend to within ±10° of vertical relative to a horizontal surface of an underlying base.

Structures (e.g., layers, materials, etc.) may be referred to as "extending horizontally" to indicate that the structures generally along a same direction as a horizontal upper surface of underlying base (e.g., substrate). The horizontally-extending structures may extend substantially parallel relative to an upper surface of the base, or not. The term "substantially parallel" means parallel to within reasonable tolerances of fabrication and measurement. In some embodiments, horizontally-structures may extend to within ±10° of vertical relative to a horizontal surface of an underlying base.

Some embodiments include an integrated assembly having a memory region with memory cells and sense/access lines configured for addressing the memory cells, and having a reference-voltage-generator proximate to the memory region. The reference-voltage-generator includes resistive units configured substantially identically to the sense/access lines.

Some embodiments include an integrated assembly having a memory region with memory cells, digit lines and wordlines. Each of the memory cells is uniquely addressed with one of the wordlines in combination with one of the digit lines. The wordlines are coupled with driver circuitry. A reference-voltage-generator is proximate to the memory region. The reference-voltage-generator includes resistive units configured substantially identically to the wordlines.

Some embodiments include an integrated assembly having a memory region with memory cells, digit lines and wordlines. Each of the memory cells is uniquely addressed with one of the wordlines in combination with one of the digit lines. The digit lines are coupled with sensing circuitry. A reference-voltage-generator is proximate to the memory region. The reference-voltage-generator includes resistive units configured substantially identically to the digit lines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    a memory region comprising memory cells and sense/access lines configured for addressing the memory cells; and
    a reference-voltage-generator proximate the memory region; the reference-voltage-generator including resistive units configured substantially identically to the sense/access lines, the resistive units comprising a first resistive unit and a second resistive unit coupled to the first resistive unit through a conductive interconnect.

2. The integrated assembly of claim 1 wherein the sense/access lines extend primarily horizontally relative to an underlying supporting base.

3. The integrated assembly of claim 1 wherein the sense/access lines extend primarily vertically relative to an underlying supporting base.

4. The integrated assembly of claim 1 wherein the sense/access lines are wordlines.

5. The integrated assembly of claim 1 wherein the sense/access lines are digit lines.

6. The integrated assembly of claim 1 wherein structures substantially identical to the memory cells are associated with the resistive units.

7. An integrated assembly, comprising:
    a memory region comprising memory cells and sense/access lines configured for addressing the memory cells;
    a reference-voltage-generator proximate the memory region; the reference-voltage-generator including resistive units configured substantially identically to the sense/access lines;
    resistive components configured to each comprise two of the resistive units paired to one another; there being at least three of the resistive components, with said three of the resistive components being a first resistive component, a second resistive component and a third resistive component;
    a first conductive interconnect coupling the first resistive component in series to the second resistive component;
    a second conductive interconnect coupling the second resistive component in series to the third resistive component; and
    switching circuitry configured to selectively couple the first and second interconnects to a reference voltage output.

8. The integrated assembly of claim 7 wherein capacitors are between the paired resistive units of each of the resistive components; the capacitors extending horizontally and the resistive units extending vertically.

9. The integrated assembly of claim 7 wherein capacitors are between the paired resistive units of each of the resistive components; wherein the capacitors are arranged to include a first set along one of the resistive units of the paired resistive units and a second set along the other of the resistive units of the paired resistive units; and wherein the first and second sets share a common plate electrode.

10. An integrated assembly, comprising:
    a memory region comprising memory cells, digit lines and wordlines; each of the memory cells being uniquely addressed with one of the wordlines in combination with one of the digit lines; the wordlines being coupled with driver circuitry; and
    a reference-voltage-generator proximate the memory region; the reference-voltage-generator including resistive units configured substantially identically to the wordlines, the resistive units comprising a first resistive unit and a second resistive unit coupled to the first resistive unit through a conductive interconnect.

11. The integrated assembly of claim 10 wherein the wordlines extend primarily horizontally relative to an underlying supporting base.

12. The integrated assembly of claim 10 wherein the wordlines extend primarily vertically relative to an underlying supporting base.

13. The integrated assembly of claim 10 wherein the wordlines have a first length and the resistive units have a second length different from the first length.

14. The integrated assembly of claim 10 wherein the wordlines and the resistive units comprise a common conductive composition.

15. The integrated assembly of claim 14 wherein said common conductive composition comprises metal.

16. The integrated assembly of claim 10 wherein structures substantially identical to the digit lines are associated with the resistive units.

17. The integrated assembly of claim 10 wherein structures substantially identical to the memory cells are associated with the resistive units.

18. The integrated assembly of claim 17 wherein said structures include capacitors.

19. An integrated assembly, comprising:
    a memory region comprising memory cells, digit lines and wordlines; each of the memory cells being uniquely addressed with one of the wordlines in combination with one of the digit lines; the wordlines being coupled with driver circuitry;

a reference-voltage-generator proximate the memory region; the reference-voltage-generator including resistive units configured substantially identically to the wordlines;

resistive components configured to each comprise two or more of the resistive units coupled to one another in series; there being at least three of the resistive components, with said three of the resistive components being a first resistive component, a second resistive component and a third resistive component;

a first conductive interconnect coupling the first resistive component in series to the second resistive component;

a second conductive interconnect coupling the second resistive component in series to the third resistive component; and switching circuitry configured to selectively couple the first and second interconnects to a reference voltage output.

20. The integrated assembly of claim 19 wherein the switching circuitry is beneath the resistive components.

21. An integrated assembly, comprising:

a memory region comprising memory cells, digit lines and wordlines; each of the memory cells being uniquely addressed with one of the wordlines in combination with one of the digit lines; the digit lines being coupled with sensing circuitry; and a reference-voltage-generator proximate the memory region; the reference-voltage-generator including resistive units configured substantially identically to the digit lines, the resistive units comprising a first resistive unit and a second resistive unit coupled to the first resistive unit through a conductive interconnect.

22. The integrated assembly of claim 21 wherein the digit lines and the resistive units comprise a common metal-containing composition.

23. The integrated assembly of claim 21 wherein the digit lines extend primarily horizontally relative to an underlying supporting base.

24. The integrated assembly of claim 21 wherein the digit lines extend primarily vertically relative to an underlying supporting base.

25. The integrated assembly of claim 21 wherein structures substantially identical to the wordlines are associated with the resistive units.

26. The integrated assembly of claim 21 wherein structures substantially identical to the memory cells are associated with the resistive units.

27. The integrated assembly of claim 26 wherein said structures include capacitors.

28. The integrated assembly of claim 27 wherein the resistive units extend primarily vertically, and the capacitors extend primarily horizontally.

29. An integrated assembly, comprising:

a memory region comprising memory cells, digit lines and wordlines; each of the memory cells being uniquely addressed with one of the wordlines in combination with one of the digit lines; the digit lines being coupled with sensing circuitry;

a reference-voltage-generator proximate the memory region; the reference-voltage-generator including resistive units configured substantially identically to the digit lines;

resistive components configured to each comprise two or more of the resistive units coupled to one another in series; there being at least three of the resistive components, with said three of the resistive components being a first resistive component, a second resistive component and a third resistive component;

a first conductive interconnect coupling the first resistive component in series to the second resistive component;

a second conductive interconnect coupling the second resistive component in series to the third resistive component; and switching circuitry configured to selectively couple the first and second interconnects to a reference voltage output.

30. The integrated assembly of claim 29 wherein the switching circuitry is beneath the resistive components.

* * * * *